United States Patent
Pyper et al.

(10) Patent No.: US 10,034,375 B2
(45) Date of Patent: Jul. 24, 2018

(54) CIRCUIT SUBSTRATE WITH EMBEDDED HEAT SINK

(71) Applicant: APPLE INC., Cupertino, CA (US)

(72) Inventors: Dennis R. Pyper, San Jose, CA (US); Venkataram R. Raju, Milpitas, CA (US); Yazan Z. Alnahhas, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/145,828

(22) Filed: May 4, 2016

(65) Prior Publication Data

US 2016/0345423 A1  Nov. 24, 2016

Related U.S. Application Data

(60) Provisional application No. 62/164,612, filed on May 21, 2015.

(51) Int. Cl.

| | |
|---|---|
| H05K 1/00 | (2006.01) |
| H05K 1/14 | (2006.01) |
| H05K 3/36 | (2006.01) |
| H05K 1/02 | (2006.01) |
| H05K 1/18 | (2006.01) |

(52) U.S. Cl.
CPC ............. *H05K 1/141* (2013.01); *H05K 1/021* (2013.01); *H05K 1/0204* (2013.01); *H05K 1/144* (2013.01); *H05K 1/183* (2013.01); *H05K 3/368* (2013.01); *H05K 2201/10416* (2013.01)

(58) Field of Classification Search
CPC ...... H05K 1/141; H05K 1/021; H05K 1/0204; H05K 1/144; H05K 1/183; H05K 3/368
USPC .................. 174/252, 250, 255–258
See application file for complete search history.

(56) References Cited

U.S. PATENT DOCUMENTS

| | | | |
|---|---|---|---|
| 4,069,463 | A | 1/1978 | McGroddy et al. |
| 5,812,571 | A | 9/1998 | Peters |
| 6,156,980 | A | 12/2000 | Peugh et al. |
| 6,597,713 | B2 | 7/2003 | Ouchi |
| 6,625,028 | B1 * | 9/2003 | Dove ............... H01L 23/13 |
| | | | 165/185 |
| 6,674,948 | B2 | 1/2004 | Yeh et al. |
| 6,936,855 | B1 | 8/2005 | Harrah |
| 7,126,218 | B1 | 10/2006 | Darveaux et al. |
| 7,271,461 | B2 | 9/2007 | Dutta |
| 7,303,005 | B2 | 12/2007 | Reis et al. |
| 7,800,067 | B1 | 9/2010 | Rajavel et al. |
| 7,949,024 | B2 | 5/2011 | Joseph |

(Continued)

OTHER PUBLICATIONS

Charbon et al., "SPAD-Based Sensors", TOF Range-Imaging Cameras, Springer-Verlag, pp. 11-38, year 2013.

(Continued)

*Primary Examiner* — Tremesha S Willis

(74) *Attorney, Agent, or Firm* — D. Kligler IP Services Ltd.

(57) ABSTRACT

An apparatus includes a main substrate, a device, and a heat spreader. The main substrate is configured for mounting the device in a mounting location thereon and having a cavity located below the mounting location. The device is mounted in the mounting location, and the heat spreader is fitted into the cavity and coupled to the device and to a heat sink. The heat spreader is configured to conduct heat from the device to the heat sink and to provide electrical insulation between the device and the heat sink.

18 Claims, 2 Drawing Sheets

(56) References Cited

U.S. PATENT DOCUMENTS

| | | | |
|---|---|---|---|
| 8,193,482 | B2 | 6/2012 | Itsler |
| 8,259,293 | B2 | 9/2012 | Andreou |
| 8,275,270 | B2 | 9/2012 | Ishushakov et al. |
| 8,355,117 | B2 | 1/2013 | Niclass |
| 8,405,020 | B2 | 3/2013 | Menge |
| 8,604,603 | B2* | 12/2013 | Lau ............... H01L 23/055 257/686 |
| 8,766,164 | B2 | 7/2014 | Sanfilippo et al. |
| 8,963,069 | B2 | 2/2015 | Drader et al. |
| 9,024,246 | B2 | 5/2015 | Jiang et al. |
| 9,052,356 | B2 | 6/2015 | Chu et al. |
| 9,076,707 | B2 | 7/2015 | Harmon |
| 9,016,849 | B2 | 8/2015 | Duggal et al. |
| 2002/0070443 | A1 | 6/2002 | Mu et al. |
| 2002/0127752 | A1 | 9/2002 | Thompson et al. |
| 2002/0176459 | A1 | 11/2002 | Martinsen |
| 2003/0081385 | A1* | 5/2003 | Mochizuki ......... H01L 23/373 361/704 |
| 2004/0001317 | A1* | 1/2004 | Getz, Jr. .............. F28F 21/02 361/703 |
| 2007/0262441 | A1 | 11/2007 | Chen |
| 2010/0164079 | A1 | 7/2010 | Dekker et al. |
| 2012/0051384 | A1 | 3/2012 | Geske et al. |
| 2013/0015331 | A1 | 1/2013 | Birk et al. |
| 2013/0342835 | A1 | 12/2013 | Blacksberg |
| 2014/0231630 | A1 | 8/2014 | Rae et al. |
| 2014/0348192 | A1 | 11/2014 | Pruijmboom et al. |
| 2014/0353471 | A1 | 12/2014 | Raynor et al. |
| 2015/0092802 | A1 | 4/2015 | Gronenvborn et al. |
| 2015/0163429 | A1 | 6/2015 | Dai et al. |
| 2015/0200222 | A1 | 7/2015 | Webster |
| 2015/0200314 | A1 | 7/2015 | Webster |
| 2015/0255955 | A1 | 9/2015 | Wang et al. |
| 2015/0342023 | A1* | 11/2015 | Refai-Ahmed ...... H05K 1/0203 361/696 |
| 2016/0300825 | A1 | 10/2016 | Hoeppel |

OTHER PUBLICATIONS

Niclass et al., "A 0.18 um CMOS SoC fora 100m range, 10 fps 200x96 pixel Time of Flight depth sensor", IEEE International Solid-State Circuits Conference—(ISSCC), Session 27, Image Sensors, 27.6, pp. 488-490, Feb. 20, 2013.

Walker et al., "A 128x96 pixel event-driven phase-domain ΔΣ-based fully digital 3D camera in 0.13 μm CMOS imaging technology", IEEE International Solid- State Circuits Conference—(ISSCC), Session 23, Image Sensors, 23.6, pp. 410-412, Feb. 23, 2011.

Mandai et al.,U.S. Appl. No. 14/975,790, filed Dec. 20, 2015.

Jiang et al., U.S. Appl. No. 15/011,562, filed Jan. 31, 2016.

Lin et al., U.S. Appl. No. 15/019,981, filed Feb. 10, 2016.

Roscher., "Flip-Chip Integration of 2-D 850nm Backside Emitting Vertical Cavity Laser Diode Arrays", Annual Report Optoelectronics Department, University of Ulm, 6 Pages, 2002.

U.S. Appl. No. 15/011,562 Office Action dated Dec. 27, 2016.

Haglund et al., "Silicon-integrated short-wavelength hybrid-cavity VCSEL", Optics Express, vol. 23, Issue 26, pp. 33634-33640, Dec. 28, 2015.

Seurin et al.,"Progress in high-power high-efficiency VCSEL arrays", SPIE OPTO: Integrated Optoelectronic Devices, Proceedings vol. 7229, Vertical-Cavity Surface-Emitting Lasers XIII, pp. 722903-1-722903-11, San Jose, United States, Jan. 24-29, 2009.

* cited by examiner

CIRCUIT SUBSTRATE WITH EMBEDDED HEAT SINK

CROSS-REFERENCE TO RELATED APPLICATIONS

This application claims the benefit of U.S. Provisional Patent Application 62/164,612, filed May 21, 2015, whose disclosure is incorporated herein by reference.

TECHNICAL FIELD

Embodiments described herein relate generally to design and production of optoelectronic assemblies, and particularly to methods and systems for reducing thermal resistance in optoelectronic assemblies.

BACKGROUND

Optoelectronic assemblies are often designed to reduce thermal resistance between high-power devices mounted on the top surface of a substrate and a heat sink coupled to the bottom surface of the substrate.

For example, U.S. Pat. No. 6,936,855, whose disclosure is incorporated herein by reference, describes a bendable light emitting diode (LED) array that includes heat spreaders, dielectric material disposed above each heat spreader, and a bendable electrical interconnection layer disposed above these heat spreaders and electrically insulated from these heat spreaders by the dielectric material. At least one via passes through the dielectric material above each heat spreader, and at least one LED die is disposed above each via.

U.S. Pat. No. 6,156,980, whose disclosure is incorporated herein by reference, describes a circuit structure and method for conducting heat from a power flip chip. Heat is dissipated from a flip chip mounted to a PCB by conducting heat through conductive vias to the opposite surface of the PCB. The flip chip is equipped with two sets of solder bumps, one of which is registered with conductors on the PCB, while the second is registered with a thermal conductor layer on the PCB surface and electrically isolated from the conductors.

SUMMARY

An embodiment that is described herein provides an apparatus, including a main substrate, a device and a heat spreader. The main substrate is configured for mounting the device in a mounting location thereon and having a cavity located below the mounting location. The device is mounted in the mounting location, and the heat spreader is fitted into the cavity and coupled to the device and to a heat sink. The heat spreader is configured to conduct heat from the device to the heat sink and to provide electrical insulation between the device and the heat sink.

In some embodiments, the main substrate is configured to provide electrical interconnections to the device. In other embodiments, the device is configured to emit light. In yet other embodiments, the main substrate includes a printed circuit board (PCB).

In an embodiment, the heat spreader includes aluminum nitride (AlN). In another embodiment, the heat spreader is configured to protrude from the cavity, beyond a surface of the main substrate that faces the heat sink. In yet another embodiment, the apparatus includes a secondary substrate that is coupled to the main substrate and is configured for mounting a peripheral device.

In some embodiments, the secondary substrate is configured to provide electrical interconnection between the peripheral device and the main substrate. In other embodiments, the secondary substrate is configured to provide electrical interconnection between the device and the main substrate.

There is additionally provided, in accordance with an embodiment that is described herein, a method for production, including producing a main substrate having a mounting location for mounting a component thereon and having a cavity located below the mounting location. A device is mounted in the mounting location. A heat spreader is fitted into the cavity and the heat spreader is coupled to the device and to a heat sink. The heat spreader conducts heat from the device to the heat sink and provides electrical insulation between the device and the heat sink.

These and other embodiments will be more fully understood from the following detailed description of the embodiments thereof, taken together with the drawings in which:

DETAILED DESCRIPTION OF EMBODIMENTS

Overview

Electronic devices, such as high-power devices comprised in optoelectronic assemblies, are prone to produce undesirable residual heat. The high-power device (e.g., a light emitter) is typically mounted on a main substrate, such as a flexible printed circuit board (PCB). In principle, one may couple a heat spreader to the device so as to conduct the residual heat from the device to a heat sink connected to the back surface of the main substrate. In some cases, however, it is desirable to prevent electrical (Galvanic) connection between the device and the heat sink. For example, in some designs the heat sink is electrically connected to ground, and it is desired to keep the device package electrically floating rather than grounded.

Embodiments that are described hereinbelow overcome this limitation by evacuating heat away from the device, while at the same time electrically isolating the device from the heat sink. In some embodiments, the main substrate is patterned so as to form a mounting location for the device. An area below the mounting location, typically as large as or larger than a cross-section area of the device, is cut-out from the main substrate so as to form a cavity. An electrically insulating heat spreader is fitted into the cavity and coupled, at one end, to the back surface of the device and, at the opposite end, to the heat sink. The heat spreader may comprise any suitable material (or a multilayered stack) that spreads the heat without conducting electrical current between the device and the heat sink. The patterned main substrate further comprises electrical interconnections between the device and additional (e.g., peripheral) active and passive devices mounted on or connected to the main substrate.

In other embodiments, the assembly may comprise a secondary substrate coupled to the main substrate. The secondary substrate may comprise a cavity within which the high-power device is fitted, and mounting locations for the peripheral devices. The secondary substrate may further comprise electrical interconnections that form electrical paths between the devices and the main substrate.

The disclosed techniques can be viewed as separating the thermal path of the device from the electrical path. These techniques may allow, for example, activating a high-power vertical-cavity surface-emitting laser (VCSEL) device, whose package is floating and not grounded.

System Description

Figure 1:
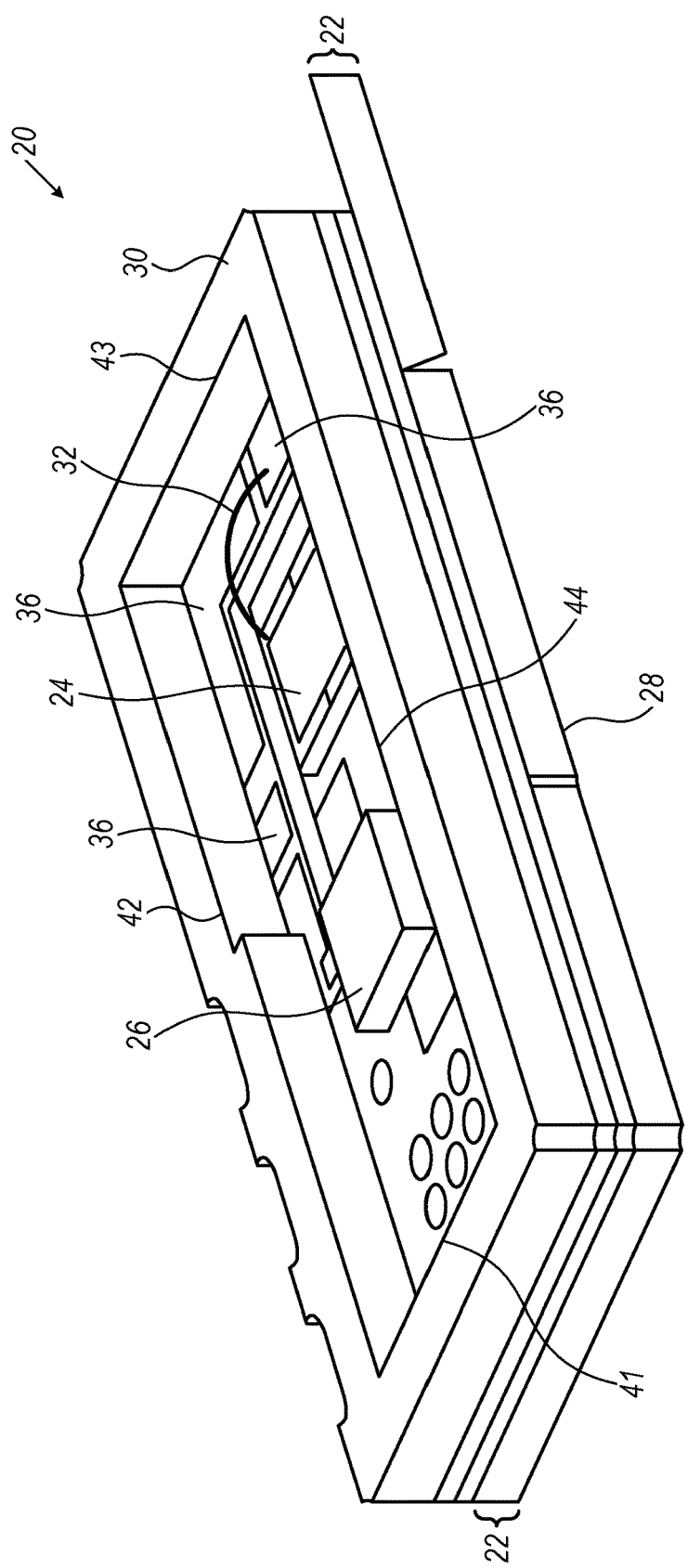
FIG. 1 is a schematic, pictorial illustration of an optoelectronic assembly, in accordance with an embodiment that is described herein.

FIG. 1 is a schematic, pictorial illustration of an optoelectronic assembly 20, in accordance with an embodiment that is described herein. Assembly 20 may be part of any suitable electronic equipment, such as a mobile phone or computing device. Assembly 20 comprises a main substrate, in the present example a flexible multilayer printed circuit board (PCB) 22, a secondary substrate 30 mounted on PCB 22, and a heat spreader 28 fitted into a cavity formed in PCB 22. PCB 22 and heat spreader 28 are described in detail in FIG. 2 below.

In some embodiments, secondary substrate 30 is fabricated from a ceramic compound, such as aluminum oxide. In alternative embodiments substrate 30 is made from any suitable material such as polymer or a mixture of ceramic and polymer materials.

Assembly 20 further comprises a high-power optoelectronic device 24, such as a vertical-cavity surface-emitting laser (VCSEL) array, made from a gallium arsenide (GaAs) chip, mounted directly on heat spreader 28 which is attached to substrate 30 using an adhesive or solder. Heat spreader 28 is used for conducting heat from device 24 to a heat sink (not shown in the figure) located below the heat spreader. In an embodiment, device 24 is mounted directly on heat spreader 28 within a cavity 60 (shown in FIG. 2), using any suitable mounting technique known in the art (such as solder or thermally conductive epoxy). The cross-section of cavity 60 has an area equal to or greater than a footprint of device 24, so as to accommodate device 24.

Assembly 20 may comprise active and passive peripheral devices that enable controlling the optoelectronic assembly and interfacing with external systems. Conductive pads 36 are patterned on substrate 30 in close proximity to device and additional devices, such as a surface mounting technology (SMT) device 26 that may serve, for example, as a controller of device 24. Devices 24 and 26 are electrically connected to pads 36 via one or more wires 32, using wire bonding or any other suitable techniques known in the art. For example, device 26 may be connected to substrate 30 and PCB 22 through bumps and redistribution layers (RDLs) (not shown) using flip-chip mounting technology.

Figure 2:
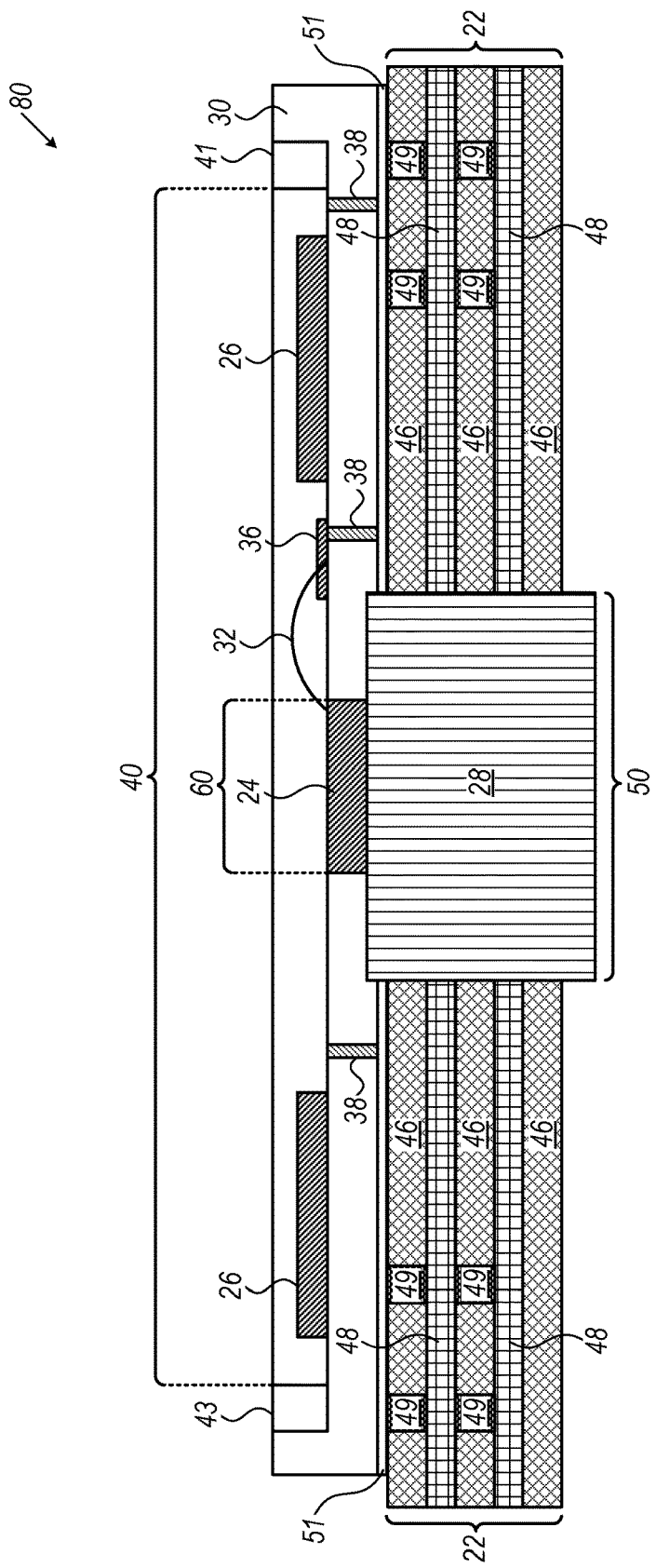
FIG. 2 is a schematic side view of an optoelectronic assembly, in accordance with an embodiment that is described herein.

Pads 36 are typically fabricated from copper (or another suitable conductive material optimized for wire bonding) and configured to provide electrical interconnections between the devices and PCB 22 via substrate 30. The electrical interconnections are depicted in FIG. 2 and described in detail below. In an embodiment, walls 41-44, typically formed by punching and co-firing methods used in multi-layer ceramic (aluminum oxide) substrate technology, define a cavity 40 (shown in FIG. 2) in substrate 30. Cavity 40 defines a domain around the devices (e.g., devices 24 and 26) and typically is not covered so as to increase the amount of light emitted from assembly 20. Typically, additional optical elements (not shown) are assembled on top of cavity 40 so as to focus the emitted light as desired in the application.

The embodiments described in FIG. 1 describe PCB 22, which is referred to herein as a main substrate of assembly 20. The main substrate may alternatively comprise any suitable substrate such as organic (e.g., conducting and insulating polymers), inorganic (e.g., ceramic, glass), hybrid (e.g., polymer/ceramic, polymer/metal) or any combination of the above. Assembly 20 further comprises substrate 30, which is referred to herein as a secondary substrate, on which components of the optoelectronic assembly (e.g., devices 24 and 26) are mounted. In the embodiments described herein substrate 30 is ceramic. Alternatively, however, the secondary substrate may comprise any other suitable material.

Thermal and Power Management in Power Devices

High-power devices, such as device 24, typically produce a considerable amount of heat in assembly 20. Heat management may be carried out using a heat spreader coupled to the back side of the high-power device. In some cases, the heat spreader may also provide electrical interconnection between the power device and the heat sink. The disclosed techniques allow independent management of the thermal path and the electrical path in assembly 20, thereby enabling sinking the heat from device 24 without necessarily grounding the device.

FIG. 2 is a schematic side view of an optoelectronic assembly 80, in accordance with an embodiment that is described herein. Assembly 80 may serve, for example, as assembly 20 of FIG. 1 above. In some embodiments, assembly comprises separate electrical and thermal paths from device 24. An electrical path connects between device 24 and PCB 22, and is separate from a heat sinking (thermal) path between device 24 and an external heat sink (not shown) located below heat spreader 28.

Referring to the electrical path, which is configured to route electrical signals and electrical power supply between PCB 22, via substrate 30, and device 24. Device 24 receives electrical signals and electrical power supply from PCB 22 through one or more vias 38, pads 36 and wires 32, all made from copper, or another suitable electrical conductor, and configured to conduct electrical current. Flexible PCB 22 comprises alternating layers of patterned metal, such as copper 48, and a flexible dielectric material, such as polyimide (PI) 46. Such a layered structure provides PCB 22 with mechanical flexibility. Electrical vias 49 etched in PI 46 and filled with conductive material (e.g., copper), and are configured to interconnect between copper layers 48. The fabrication process of PCB 22, including the formation of cavity 50, are described below.

A patterned layer 51 located on the top surface of PCB 22 is typically made from copper and configured to connect PCB 22 with vias 38. The electrical path may be applied to electrically connect between PCB 22 and additional devices, such as device 26 comprised in assembly 80.

Referring to the thermal path formation process. Cavity 50 is formed by cutting out a section of PCB 22 located directly below device 24. Cavity 50 is as large as or larger than the cross-sectional area of heat spreader 28 on which device 24 or any alternative device (e.g., a light emitting diode) that is to be mounted thereon. Heat spreader 28 is fitted into cavity 50 so as to conduct to heat from device 24 to the heat sink (not show) located directly below the heat spreader, thereby forming the thermal path.

After layers 46, 48, 51 and vias 49 have been patterned, the layers are fused together using a conventional lamination process. Cavity 60 and vias 38 are formed in substrate 30 using patterning methods known in the art. Vias 38 are filled with conductive material and pads 36 are formed using any suitable plating and patterning processes known in the art.

Typically, heat spreader 28 and devices 24 and 26 are mounted and wire bonded after substrate 30 and PCB 22 are completed. The sequence of the device mounting may vary to comply with design and process technology constraints. In some embodiments, heat spreader 28 is fitted within cavity 50 directly below the mounting location of device 24 in substrate 30. Heat spreader 28 may comprise any suitable material, or stack of materials, with desired mechanical and thermal properties.

In an embodiment, heat spreader 28 is fabricated from a single bulk of a ceramic compound, such as aluminum nitride (AlN), which is thermally-conductive and electrically-insulating. In other embodiments, heat spreader 28 may comprise a stack of layers made from materials that provide thermal-conductance and electrical-insulation. The choice of an electrically-insulating or electrically-conductive heat spreader depends, inter alia, on whether or not electrical isolation is required. In an alternative embodiment, heat spreader 28 may be made of an electrically conductive material, such as copper, in case electrical insulation is not required.

Device 24 is fitted into cavity 60 and coupled (e.g., glued or soldered) to the top surface of heat spreader 28, for example, using thermally conductive adhesive or solder (not shown). SMT devices 26 are typically mounted sequentially before or after device 24, using pick and place techniques or other methods known in the art. Next, all the mounted devices are connected to pads 36 using wires 32 or any alternative wire bonding or bumping techniques known in the art.

In an alternative mounting sequence, device 24 may be fitted into cavity 60 first (typically sequentially with devices 26, during the picking and placing of all devices on substrate 30), and heat spreader 28 may be fitted into cavity 50 and coupled to device 24 followed by the wire bonding process described above.

The cross-sectional dimensions of heat spreader 28 are typically 3×2 mm and the spreader is about 0.5 mm thick, but larger or smaller dimensions may alternatively be used depending, for example, on application requirements and the dimensions of device 24. As shown in FIG. 2, it can be advantageous to make the embedded heat spreader thick enough to protrude below the lowest PCB layer, in order to facilitate coupling the external heat sink (not shown) to the heat spreader.

Although FIG. 2 shows a particular flexible PCB design and configuration with a cavity for insertion of heat spreader 28, other designs implementing the principles of this embodiment using different sorts of PCB and heat spreader materials, as well as other geometrical configurations, will be apparent to those skilled in the art after reading the present disclosure and are considered to be within the scope of the present invention.

Although the embodiments described herein mainly address optoelectronic assemblies, the methods and systems described herein can also be used in other applications, such as in any type of electronic assembly comprising any type of device that dissipates a large amount of heat.

It will thus be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a main substrate, configured for mounting a component in a mounting location thereon and having a cavity located below the mounting location;
a device, mounted in the mounting location; and
a heat spreader, fitted into the cavity and coupled directly to the device and to a grounded heat sink, wherein the heat spreader is made from a material configured to conduct heat from the device to the grounded heat sink and to provide electrical insulation between the device and the grounded heat sink, such that the device is electrically floating relative to the grounded heat sink.

2. The apparatus according to claim 1, wherein the main substrate is configured to provide electrical interconnections to the device.

3. The apparatus according to claim 1, wherein the device is configured to emit light.

4. The apparatus according to claim 1, wherein the main substrate comprises a printed circuit board (PCB).

5. The apparatus according to claim 1, wherein the heat spreader comprises aluminum nitride (AlN).

6. The apparatus according to claim 1, wherein the heat spreader is configured to protrude from the cavity, beyond a surface of the main substrate that faces the grounded heat sink.

7. The apparatus according to claim 1, and comprising a secondary substrate that is coupled to the main substrate and is configured for mounting a peripheral device.

8. The apparatus according to claim 7, wherein the secondary substrate is configured to provide electrical interconnection between the peripheral device and the main substrate.

9. The apparatus according to claim 7, wherein the secondary substrate is configured to provide electrical interconnection between the device and the main substrate.

10. A method for production, comprising:
producing a main substrate having a mounting location for mounting a component thereon and having a cavity located below the mounting location;
mounting a device in the mounting location; and
fitting a heat spreader into the cavity and coupling the heat spreader directly to the device and to a grounded heat sink, wherein the heat spreader is made from a material that conducts heat from the device to the grounded heat sink and provides electrical insulation between the device and the grounded heat sink, such that the device is electrically floating relative to the grounded heat sink.

11. The method according to claim 10, wherein producing the main substrate comprises providing on the main substrate electrical interconnections to the device.

12. The method according to claim 10, wherein mounting the device comprises mounting a light emitter.

13. The method according to claim 10, wherein producing the main substrate comprises producing a printed circuit board (PCB).

14. The method according to claim 10, wherein the heat spreader comprises aluminum nitride (AlN).

15. The method according to claim 10, wherein fitting the heat spreader comprises fitting the heat spreader to protrude from the cavity beyond a surface of the main substrate that faces the grounded heat sink.

16. The method according to claim 10, and comprising producing a secondary substrate, coupling the secondary substrate to the main substrate and mounting a peripheral device on the secondary substrate.

17. The method according to claim 16, wherein producing the secondary substrate comprises providing on the secondary substrate electrical interconnection between the peripheral device and the main substrate.

18. The method according to claim 16, wherein producing the secondary substrate comprises providing on the secondary substrate electrical interconnection between the device and the main substrate.

\* \* \* \* \*